(12) United States Patent
Chern et al.

(10) Patent No.: US 10,504,874 B2
(45) Date of Patent: Dec. 10, 2019

(54) STRUCTURES AND METHODS FOR PROVIDING ELECTRICAL ISOLATION IN SEMICONDUCTOR DEVICES

(71) Applicant: Taiwan Semiconductor Manufacturing Company Limited, Hsinchu (TW)

(72) Inventors: Chan-Hong Chern, Palo Alto, CA (US); Mark Chen, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/224,771

(22) Filed: Aug. 1, 2016

(65) Prior Publication Data

US 2018/0033776 A1    Feb. 1, 2018

(51) Int. Cl.
*H01L 25/07* (2006.01)
*H01L 25/00* (2006.01)
(Continued)

(52) U.S. Cl.
CPC ........ *H01L 25/072* (2013.01); *H01L 21/0254* (2013.01); *H01L 21/4853* (2013.01); *H01L 23/49827* (2013.01); *H01L 23/49833* (2013.01); *H01L 23/49844* (2013.01); *H01L 24/17* (2013.01); *H01L 24/81* (2013.01); *H01L 25/50* (2013.01); *H01L 29/2003* (2013.01); *H01L 29/205* (2013.01); *H01L 29/66462* (2013.01); *H01L 29/7787* (2013.01); *H01L 2224/16225* (2013.01); *H01L 2924/01014* (2013.01); *H01L 2924/1033* (2013.01); *H01L 2924/10344* (2013.01); *H01L 2924/13064* (2013.01); *H01L 2924/15311* (2013.01); *H01L 2924/15738* (2013.01); *H01L 2924/381* (2013.01)

(58) Field of Classification Search
CPC ............... H01L 25/072; H01L 21/4853; H01L 29/66462; H01L 29/7787; H01L 29/205; H01L 29/2003; H01L 21/0254; H01L 24/81; H01L 23/49827; H01L 23/49833; H01L 23/49844; H01L 24/17; H01L 25/50
See application file for complete search history.

(56) References Cited

U.S. PATENT DOCUMENTS

2013/0062760 A1*  3/2013  Hung ............... H01L 21/561
                                                                257/738
2014/0131894 A1*  5/2014  Yu ................. H01L 23/315
                                                              257/777

(Continued)

*Primary Examiner* — Moazzam Hossain
*Assistant Examiner* — Stanetta D Issac
(74) *Attorney, Agent, or Firm* — Jones Day (57) ABSTRACT

Semiconductor package structures and methods of forming the same are provided. An interposer is bonded to a printed circuit board (PCB) or package substrate through first solder bumps disposed on a first side of the interposer. The first solder bumps have a first pitch. A plurality of semiconductor chips are formed, and each of the semiconductor chips is bonded to a second side of the interposer through second solder bumps. The second solder bumps have a second pitch that is less than the first pitch. Each of the semiconductor chips includes a substrate with one or more transistors or integrated circuits formed thereon.

20 Claims, 11 Drawing Sheets

(51) Int. Cl.
*H01L 23/00* (2006.01)
*H01L 23/498* (2006.01)
*H01L 21/48* (2006.01)
*H01L 29/20* (2006.01)
*H01L 29/205* (2006.01)
*H01L 29/778* (2006.01)
*H01L 29/66* (2006.01)
*H01L 21/02* (2006.01)

(56) References Cited

U.S. PATENT DOCUMENTS

| | | | |
|---|---|---|---|
| 2014/0225275 A1* | 8/2014 | Shimizu | H01L 23/49827 257/774 |
| 2015/0014844 A1* | 1/2015 | Wu | H01L 23/49811 257/737 |
| 2015/0048503 A1* | 2/2015 | Chiu | H01L 21/486 257/738 |
| 2015/0270249 A1* | 9/2015 | Cho | H01L 25/072 327/109 |

* cited by examiner

STRUCTURES AND METHODS FOR PROVIDING ELECTRICAL ISOLATION IN SEMICONDUCTOR DEVICES

BACKGROUND

Scaling of semiconductor devices, such as metal-oxide semiconductor field-effect transistor (MOSFET) devices, has enabled continued improvement in speed, performance, density, and cost per unit function of integrated circuits over the past few decades. Improvements to integrating transistors that operate in different power domains can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

When multiple circuit components (e.g., transistors, etc.) are formed on a common substrate, unwanted electrical coupling can occur between the components. In examples, the coupling occurs via the common substrate. Under the approaches of the instant disclosure, to eliminate or mitigate such coupling issues, circuit components are formed on separate semiconductor chips. The separate semiconductor chips do not share a common substrate, and this eliminates or mitigates the coupling issues described above. To ensure that the semiconductor chips are located sufficiently close to each other, an interposer is used. Specifically, the separate semiconductor chips are bonded to a surface of the interposer using relatively small solder microbumps. As described below, the use of the interposer and the relatively small solder microbumps enables the separate semiconductor chips to be located sufficiently close to each other while still providing electrical isolation between the semiconductor chips.

The structures and methods disclosed herein are usable in a variety of different semiconductor structures. For instance, the structures and methods of the instant disclosure are used to provide electrical isolation between gallium nitride (GaN) transistors and GaN integrated circuits (ICs), in examples. When multiple GaN transistors are formed on a common substrate, unwanted electrical coupling can occur between the transistors via the substrate. Such electrical coupling is especially problematic when different body biases are applied to the GaN transistors. This electrical coupling can degrade performance or result in circuit malfunctioning, among other issues.

Under the approaches of the instant disclosure, such issues are mitigated or eliminated by forming GaN transistors and GaN ICs on separate semiconductor chips. The separate semiconductor chips are bonded to a surface of an interposer using solder bumps. Bonding the separate semiconductor chips to the interposer provides electrical isolation between the semiconductor chips, thus enabling different body biases to be applied to the respective chips without electrical coupling between the chips. The use of the interposer and relatively small solder bumps enables the chips to be placed relatively close to each other, thus significantly reducing parasitic inductances, parasitic resistances, and parasitic capacitances that can result when the chips are placed too far away from each other. These advantages and others of the instant disclosure are explained in further detail below.

Although example structures and methods for electrically isolating GaN transistors and GaN ICs formed on silicon substrates are provided below, it is noted that the instant disclosure is not limited to this context. For example, although GaN and AlGaN III-V semiconductor materials (e.g., Group III-Group V semiconductor materials) are utilized in examples described below, in other examples, different III-V semiconductor materials (e.g., GaAs, AlGaAs, AlGaInP, etc.) are utilized. More generally, the structures and methods for isolating transistors and ICs described herein can be used in semiconductor structures that do not include III-V semiconductor materials. Further, although silicon substrates are utilized in examples described below, in other examples, other types of substrates (e.g., Ge, SiGe, GaAs, InP, GaN, ZnS, ZnSe, SiC, etc.) are utilized.

Figure 1A:
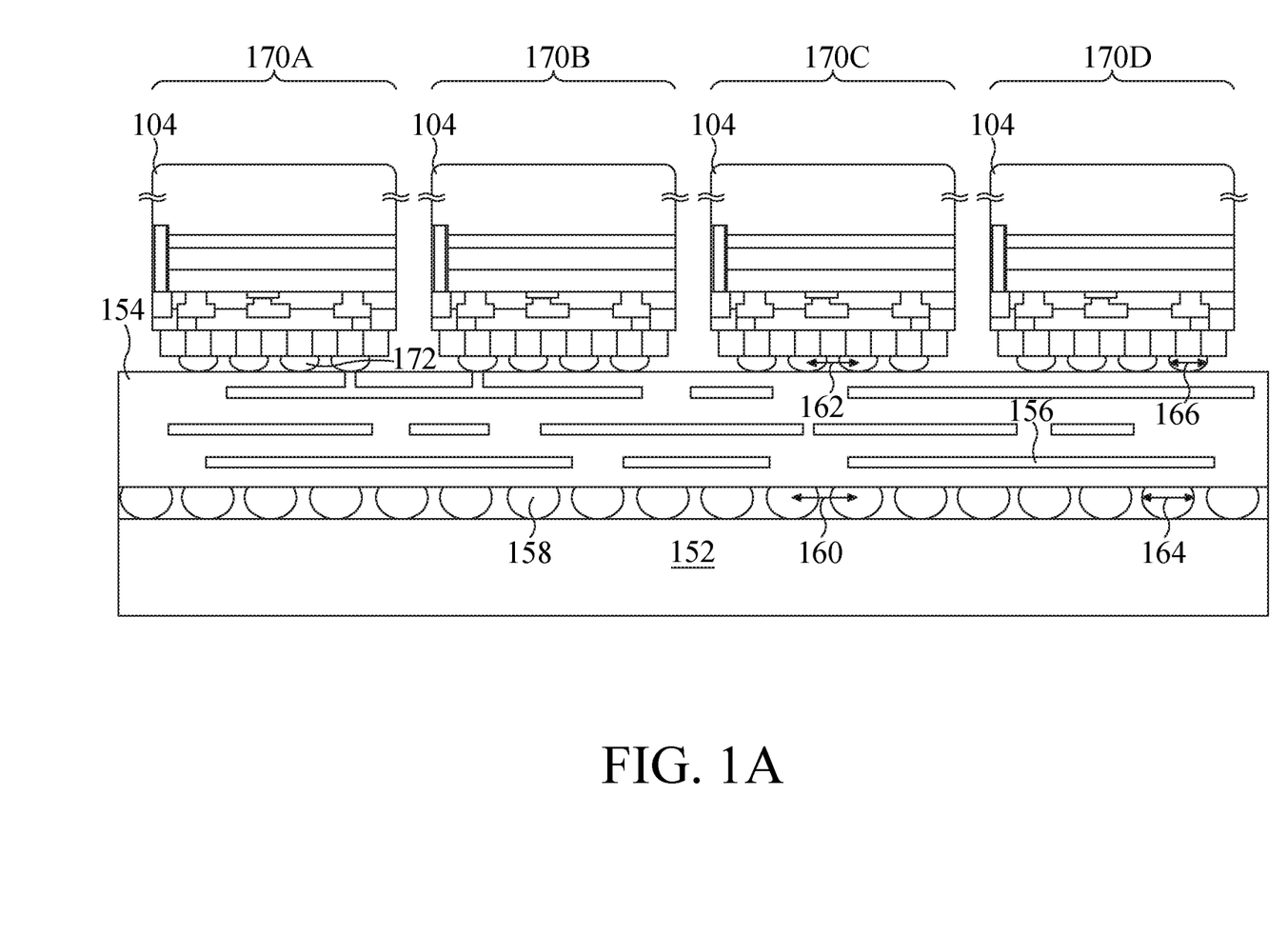
FIG. 1A depicts an example semiconductor package structure, in accordance with some embodiments.

FIG. 1A depicts an example semiconductor package structure, in accordance with some embodiments. The structure includes a printed circuit board (PCB) 152 known to those of ordinary skill in the art. An interposer 154 is bonded to the PCB 152 through first solder bumps 158 disposed on a first side of the interposer 154. The first solder bumps 158 have a diameter 164 and a bump-to-bump pitch 160, as illustrated in the figure. The bump-to-bump pitch 160 is a distance between center regions of two adjacent solder bumps 158. In examples, the interposer 154 comprises silicon material and has metal lines and metal vias 156 formed within the silicon. The metal lines and metal vias 156 are used to route signals between respective chips 170A-

170D and/or between the chips 170A-170D and the solder bumps 158. Such signals include, for instance, power signals, ground signals, data signals, and body bias signals, among others. The metal lines and metal vias 156 are relatively large and have dimensions (e.g., line widths, thicknesses, lengths, etc.) on the order of micrometers and millimeters, in examples.

A plurality of semiconductor chips 170A, 170B, 170C, 170D are bonded to a second side of the interposer 154 through second solder bumps 172. The second solder bumps 172 have a bump-to-bump pitch 162 that is less than the pitch 160 of the first solder bumps 158. Further, the second solder bumps 172 have a diameter 166 that is less than the diameter 164 of the first solder bumps 158. Because of their relatively small dimensions, the solder bumps 172 may be characterized as "microbumps." Each of the semiconductor chips 170A-170D includes a silicon substrate 104 with one or more transistors formed on the silicon substrate 104. In the example of FIG. 1A, the one or more transistors formed on a respective semiconductor chip of the semiconductor chips 170A-170D include gallium nitride (GaN) transistors (e.g., GaN HEMTs) formed on the silicon substrate 104. Such GaN transistors formed on the silicon substrates 104 are explained in further detail below with reference to FIG. 1B.

As illustrated in FIG. 1A, adjacent semiconductor chips 170A-170D bonded to the interposer 154 are separated by air gaps or insulating passivation material. The air gaps or insulating passivation material separating adjacent chips 170A-170D provide electrical isolation between the adjacent chips, which enables different body biases to be applied to GaN transistors formed on different chips. Thus, as shown in the example of FIG. 1A, a body bias "A" is applied to the GaN transistors formed on the semiconductor chip 170A, a body bias "B" is applied to the GaN transistors formed on the semiconductor chip 170B, and so on. For instance, GaN transistors formed on the semiconductor chip 170A may receive a relatively low body bias voltage, while GaN transistors formed on the semiconductor chip 170B may receive a relatively high body bias voltage. A body bias is a voltage that is applied to the substrate (or a portion of the substrate) on which a transistor is formed.

In conventional systems, multiple GaN transistors are typically formed on a common substrate. In these conventional systems, unwanted electrical coupling can occur between the transistors via the common substrate. Such electrical coupling is especially problematic when different body biases are applied to the GaN transistors, and the electric coupling can degrade performance or result in circuit malfunctioning, among other issues. Under the approaches of the instant disclosure, to eliminate or mitigate such coupling issues, GaN transistors are formed on the separate semiconductor chips 170A-170D that do not share a common substrate. As noted above, the air gaps or insulating passivation material separating adjacent semiconductor chips 170A-170D provide electrical isolation that eliminates or mitigates electrical coupling between the chips 170A-170D.

In examples, the semiconductor chips 170A-170D are bonded to the interposer 154 in an arrangement that minimizes distances between adjacent semiconductor chips 170A-170D. The distances are minimized, in embodiments, through the use of the relatively small bumps 172. Parasitic inductances, parasitic resistances, and parasitic capacitances can result when adjacent semiconductor chips 170A-170D are placed too far away from each other. By using the interposer 154 and bonding the chips 170A-170D to the interposer in an arrangement that minimizes the distances between the chips 170A-170D, such parasitics are eliminated or mitigated. Specifically, in bonding the semiconductor chips 170A-170D to the interposer 154, the relatively small solder microbumps 172 can be realized. The relatively small microbumps 172 can be realized due the standard silicon processes that are used in bonding the semiconductor chips 170A-170D to the interposer 154. The bumps 172 formed using such standard silicon processes can be made smaller than the bumps 158 used in bonding the interposer 154 to the PCB 152, with the bumps 158 being larger due to limitations in packaging technology. The microbumps 172 have diameters of approximately 10 µm or less, for instance. The relatively small solder microbumps 172 are in contrast to the relatively large solder bumps that would be required if the chips 170A-170D were bonded directly to the PCB 152. The solder bumps 158 are characteristic of the relatively large solder bumps that would be required if the chips 170A-170D were bonded directly to the PCB 152. These solder bumps 158 can have diameters of 100-300 µm, for instance. As described above, the larger diameters of the bumps 158 are a result of limitations in packaging technology.

Because the diameters of the microbumps 172 are relatively small, the bump-to-bump pitch 162 for the microbumps 172 is likewise relatively small. With the relatively small diameters and pitch of the microbumps 172, the semiconductor chips 170A-170D can be placed in relatively close proximity to each other, thus eliminating or mitigating the parasitic inductances, resistances, and capacitances that could result if the chips 170A-170D were spaced farther apart. It is noted that if the chips 170A-170D were bonded directly to the PCB 152 using the relatively large solder bumps discussed above, distances between adjacent chips would be larger, and higher parasitics would result. Thus, the use of the interposer 154 and the relatively small solder microbumps 172 enables the semiconductor chips 170A-170D to be located sufficiently close to each other while still providing the air gaps or insulating passivation material for electrical isolation between the chips 170A-170D.

Figure 1B:
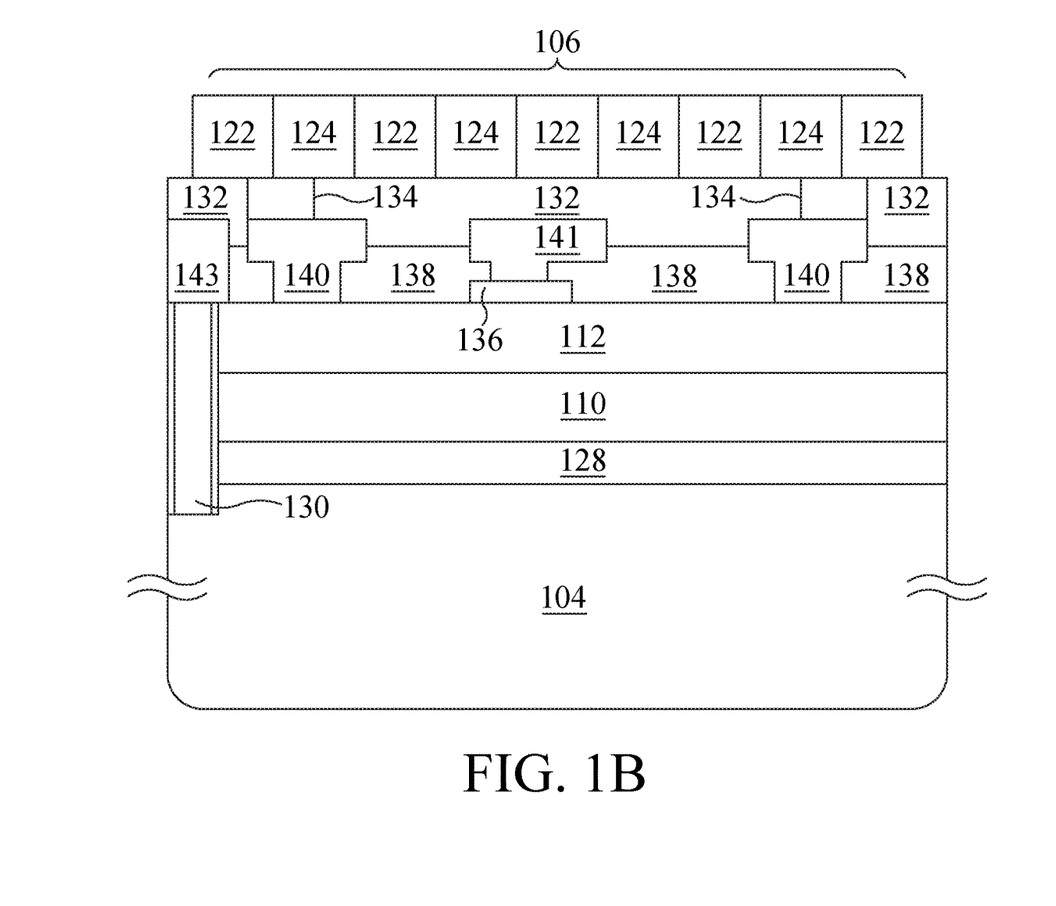
FIG. 1B depicts an example gallium nitride (GaN) transistor formed on a silicon substrate, in accordance with some embodiments.

As discussed above, in the example of FIG. 1A, each of the semiconductor chips 170A-170D comprises a silicon substrate 104 with one or more GaN transistors (e.g., GaN HEMTs) formed thereon. An example GaN transistor 106 formed on a silicon substrate 104 is illustrated in FIG. 1B. To form the GaN transistor 106 of FIG. 1B, a number of layers are formed over the silicon substrate 104 using an epitaxial process. The layers include a GaN layer 110, which is formed over an optional transition layer 128 or directly on the silicon substrate 104. In examples, the GaN layer 110 comprises a channel layer for the GaN transistor 106 or a portion of such a channel layer. The transition layer 128 includes a nucleation layer of aluminum nitride (AlN) and/or a buffer layer comprising a different material, in examples.

The example GaN transistor 106 of FIG. 1B includes an aluminum gallium nitride (AlGaN) layer 112 formed on top of the GaN layer 110. The AlGaN layer 112 comprises an active layer (e.g., donor-supply layer), in examples, and an interface exists between the GaN layer 110 and the AlGaN layer 112. In examples, a carrier channel of two-dimensional electron gas (2-DEG) is located at the interface between the layers 110, 112. In other examples, the AlGaN layer 112 is replaced with a layer comprising another material, such as AlGaAs or AlInP, for instance.

Source and drain features 140 for the GaN transistor 106 are configured to electrically connect to the GaN layer 110, the AlGaN layer 112, and/or the carrier channel located at the interface between the layers 110, 112. Each of the source and drain features 140 comprises a metallic material or metal alloy, in examples. The metallic material or metal alloy is embedded in the AlGaN layer 112 and may be further embedded in a top portion of the GaN layer 110. In examples, the metallic material or metal alloy comprises Al, Ti, Cu, AlN, TiN, Al3Ti, or AlTiN, for instance.

The GaN transistor 106 of FIG. 1B further includes a gate structure 141 that is disposed on a polarization modulation layer 136 and between the source and drain features 140. The gate 141 includes a conductive material which functions as a gate electrode for receiving a bias voltage. In various examples, the conductive material includes a refractory metal or its compounds (e.g., tungsten (W), titanium nitride (TiN), tantalum (Ta), etc.). Other commonly used metals for the gate 141 include nickel (Ni) and gold (Au), for instance. The gate structure 141 may include one layer or multiple layers of different materials.

A passivation material 138 is formed over the AlGaN layer 112. The passivation material 138 provides electrical stability by isolating the transistor surface (e.g., portions of the AlGaN layer 112 in the example of FIG. 1B) from electrical and chemical conditions in the environment. The passivation material 138 thus reduces reverse-current leakage, increases breakdown voltage, and raises a power dissipation rating of the transistor 106, in examples. The passivation material 138 may be silicon oxide, silicon nitride, silicon oxynitride, carbon doped silicon oxide, carbon doped silicon nitride, carbon doped silicon oxynitride, zinc oxide, zirconium oxide, hafnium oxide, titanium oxide, or another suitable material. A dielectric material 132 (labeled "inter-layer dielectric" or "ILD" in the example of FIG. 1B) is formed over the passivation material 138, the source and drain features 140, and the gate structure 141. Metallic contacts 134 are deposited over the source and drain features 140. A layer including insulating material 122 and conductive vias 124 is formed over the dielectric material 132. The conductive vias 124 are used to make electrical connections to the microbumps 172, in examples.

A through-GaN via 130 electrically connects a body bias feature 143 to the silicon substrate 104. Like the source and drain features 140, the body bias feature 143 comprises a metallic material or metal alloy (e.g., Al, Ti, Cu, AlN, TiN, Al3Ti, AlTiN, etc.), in examples. The through-GaN via 130 extends from the body bias features 143, through the layers 110, 112, 128, 138, and into the silicon substrate 104, as shown in the figure. To electrically connect the body bias feature 143 to the silicon substrate 104, the through-GaN via 130 comprises a conductive material, in examples. The through-GaN via 130 further comprises an insulating material that covers sidewalls of the via. Using the body bias feature 143 and the through-GaN via 130, a voltage can be applied to the silicon substrate 104 (or a portion of the silicon substrate 104).

In the semiconductor package structure of FIG. 1A, multiple semiconductor chips 170A-170D are bonded to an interposer 154, and the interposer 154 is bonded to a PCB 152. In other examples, a similar approach is implemented using a package substrate instead of a PCB. To illustrate such examples, reference is made to FIG. 1C. In this figure, the interposer 154 is bonded to a package substrate 180 through the first solder bumps 158. The package substrate 180 includes third solder bumps 182, as illustrated in the figure. In embodiments, the package substrate 180 is a bismaleimide trianzine (BT) substrate, a silicon-based package substrate, or other commonly used substrate capable of having chips packaged thereon. As in the example of FIG. 1A, multiple semiconductor chips 170A-170D are bonded to the interposer 154 via the micro bumps 172. Bonding the chips 170A-170D to the interposer 154 provides electrical isolation between the chips 170A-170D while enabling distances between adjacent chips 170A-170D to be minimized, as discussed above.

Figure 1C:
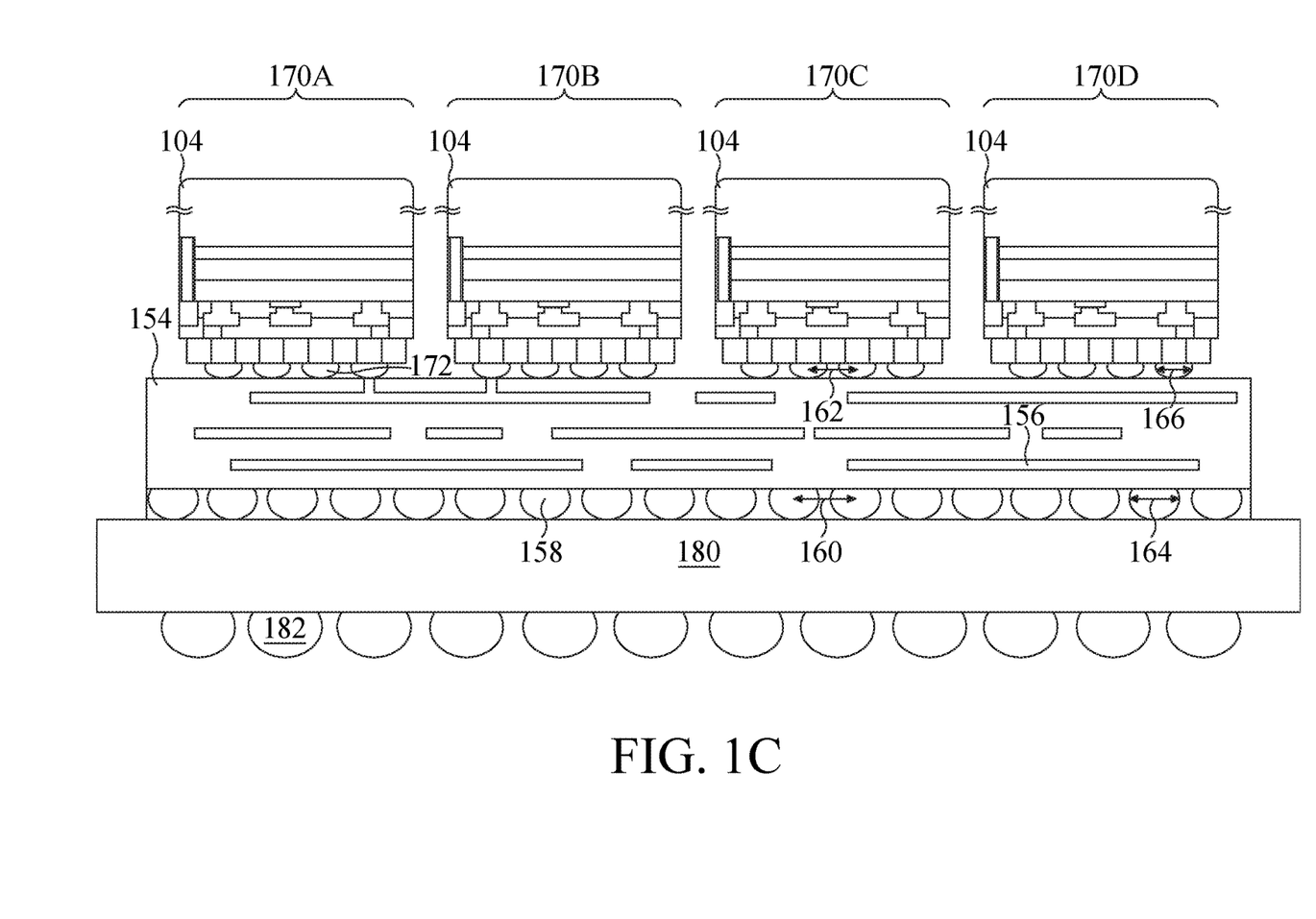
FIGS. 1C-1E depict example semiconductor package structures, in accordance with some embodiments.

FIGS. 1A and 1C illustrate the use of a three-dimensional (3D) integration scheme for isolating GaN transistors formed on separate semiconductor chips 170A-170D. In other examples, a similar approach is used to provide electrical isolation between GaN/Si integrated circuits (ICs). To illustrate such examples, reference is made to FIG. 1D. This figure depicts the (i) PCB 152, and (ii) interposer 154 bonded to the PCB 152 via the first solder bumps 158, as in FIG. 1A. Semiconductor chips 184A, 184B, 184C, 184D are bonded to the interposer 154 through the second solder bumps 172. Each of the semiconductor chips 184A-184D includes a silicon substrate 186 with one or more ICs formed on the silicon substrate 186. The ICs formed on the respective chips 184A-184D may be characterized as "GaN/Si ICs," because they include one or more GaN layers formed over the silicon substrate 186. In examples, a GaN/Si IC can include tens, hundreds, or thousands of transistors (e.g., GaN transistors, such as those described above), with such transistors being connected to implement a function (e.g., a logic function, a mathematical function, a circuit function, etc.).

Figure 1D:
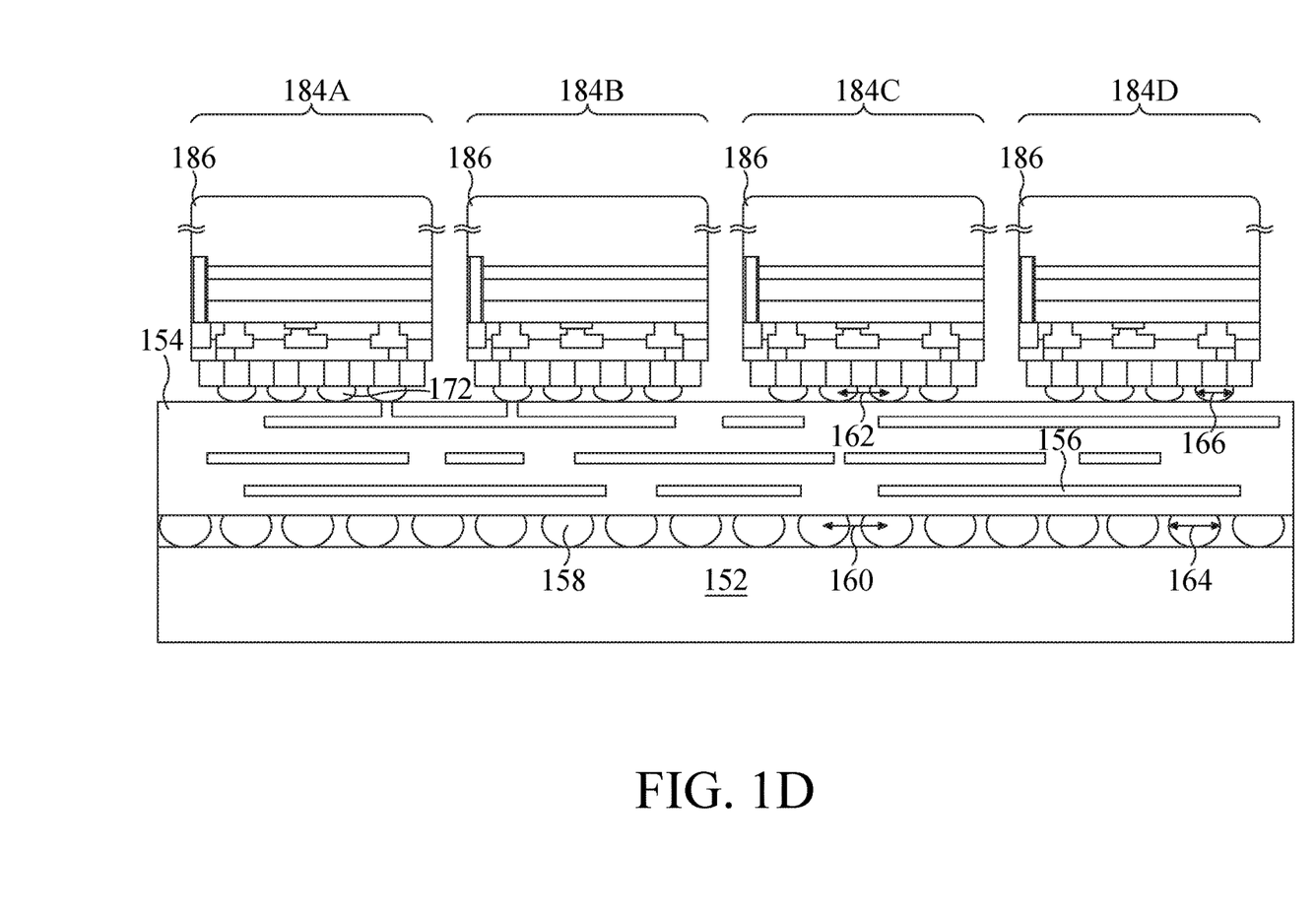

As illustrated in FIG. 1D, adjacent semiconductor chips 184A-184D bonded to the interposer 154 are separated by air gaps or insulating passivation material. The air gaps or insulating passivation material separating adjacent chips 184A-184D provide electrical isolation between the adjacent chips, which enables the chips 184A-184D to be operated in different power domains. Thus, as shown in the example of FIG. 1D, an IC formed on the chip 184A operates in a power domain "A," an IC formed on the chip 184B operates in a power domain "B," and so on. For instance, the GaN/Si IC formed on the semiconductor chip 184A may operate at relatively high voltages, such that it operates in a relatively high power domain, while the GaN/Si IC formed on the semiconductor chip 184B may operate at relatively low voltages, such that it operates in a relatively low power domain.

In conventional systems, multiple GaN/Si ICs are typically formed on a common substrate. In these conventional systems, unwanted electrical coupling can occur between the ICs via the common substrate. Such electrical coupling is especially problematic when the ICs are operated in different power domains, and the coupling can degrade performance or result in circuit malfunctioning, among other issues. Under the approaches of the instant disclosure, to eliminate or mitigate such coupling issues, GaN/Si ICs are formed on the separate semiconductor chips 184A-184D that do not share a common substrate. Air gaps or insulating passivation material separating adjacent semiconductor chips 184A-184D provide electrical isolation that eliminates or mitigates electrical coupling between the chips 184A-184D. Additionally, the semiconductor chips 184A-184D are bonded to the interposer 154 in an arrangement that minimizes distances between adjacent semiconductor chips 184A-184D. This approach eliminates or mitigates parasitic inductances, parasitic resistances, and parasitic capacitances that can result when adjacent semiconductor chips are placed too far away from each other, as described above with reference to FIG. 1A.

Figure 1E:
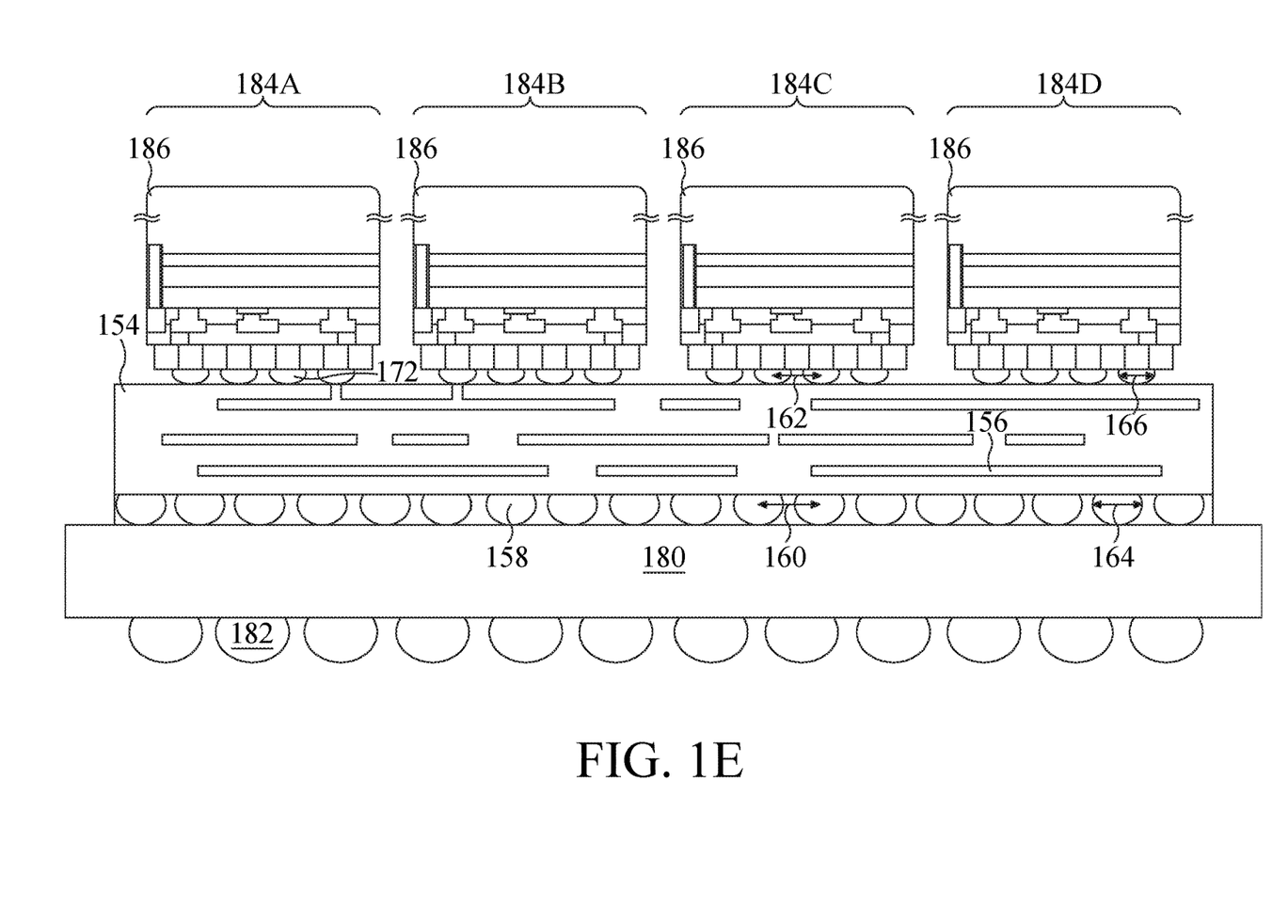

In the semiconductor package structure of FIG. 1D, the semiconductor chips 184A-184D are bonded to an interposer 154, and the interposer 154 is bonded to a PCB 152. In other examples, a similar approach is implemented using a package substrate instead of a PCB. To illustrate such examples, reference is made to FIG. 1E. In this figure, the interposer 154 is bonded to the package substrate 180 through the first solder bumps 158. Similar to the semiconductor package structure of FIG. 1D, the semiconductor package structure of FIG. 1E provides electrical isolation between the chips 184A-184D while enabling distances between adjacent chips 184A-184D to be minimized.

Figure 2:
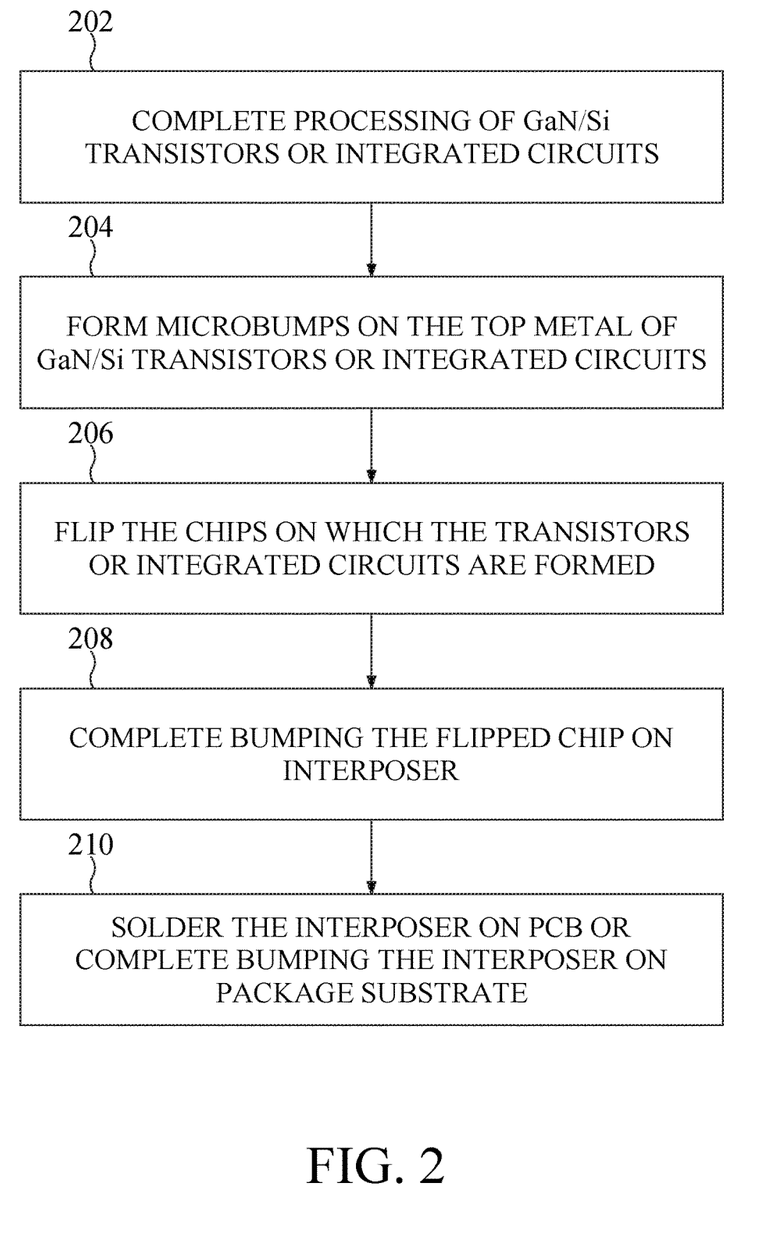
FIG. 2 is a flowchart depicting steps of an example method for providing electrical isolation between semiconductor chips, in accordance with some embodiments.
Figure 3A:
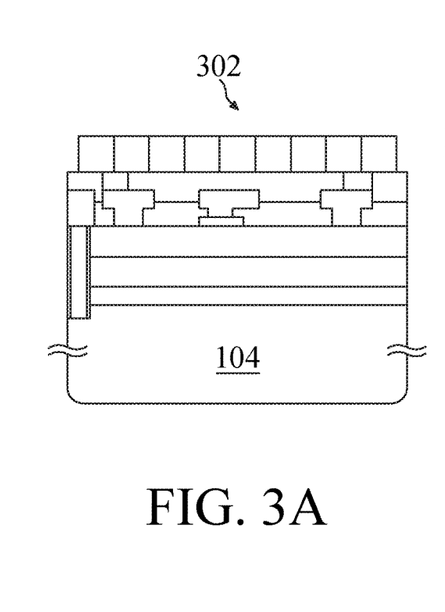
FIGS. 3A-3D and 4A-4D depict steps of example processes for bonding semiconductor chips to an interposer, in accordance with some embodiments.
Figure 3B:
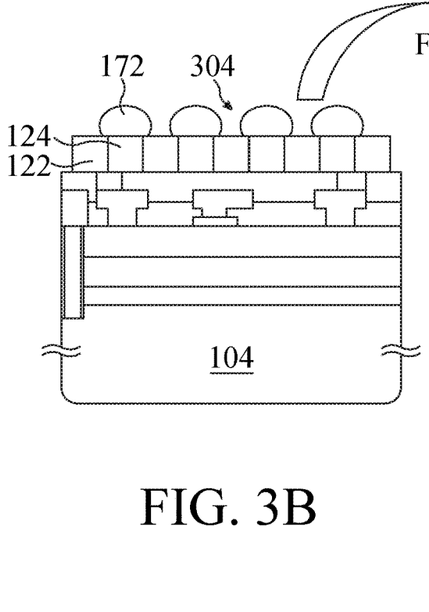
Figure 3C:
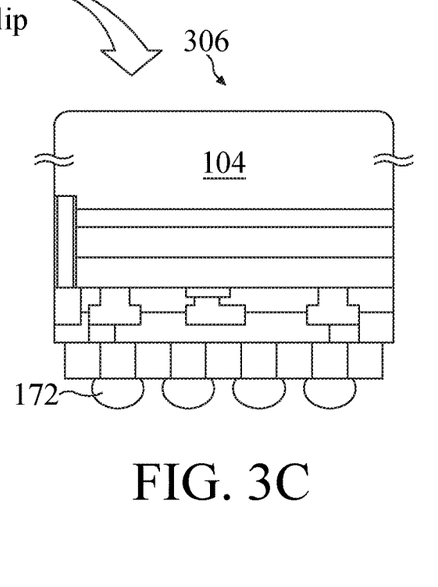
Figure 3D:
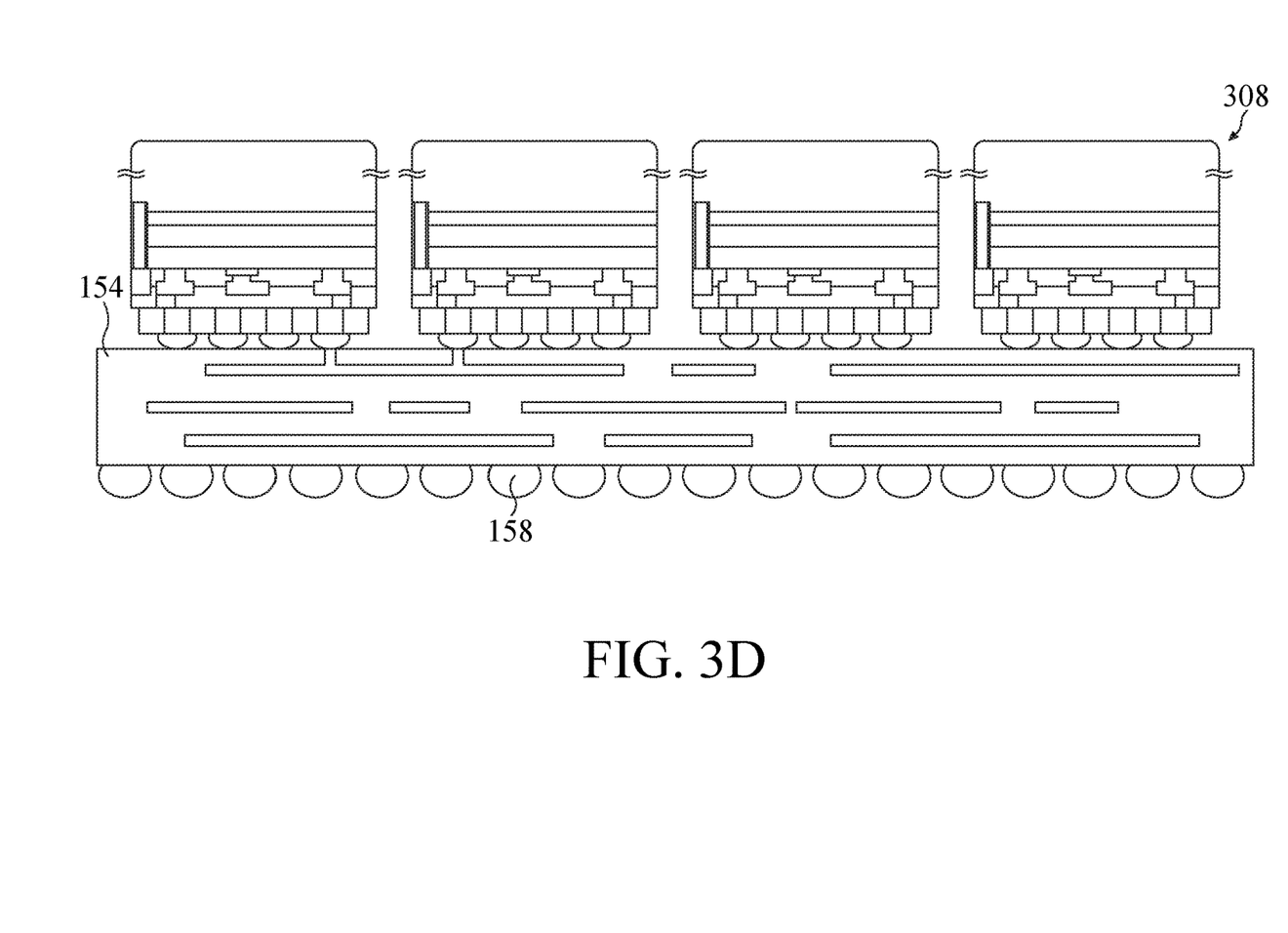
Figure 4A:
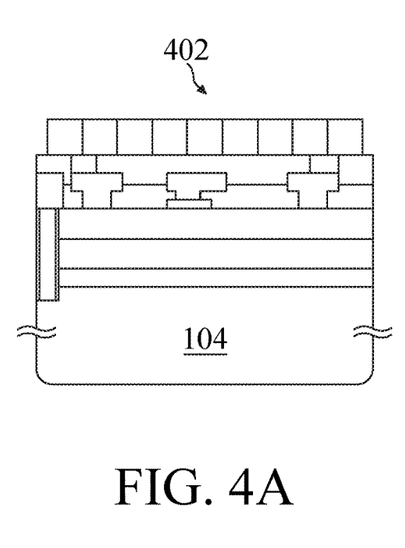

FIG. 2 is a flowchart depicting steps of an example method for providing electrical isolation between semiconductor chips, in accordance with some embodiments. At step 202, processing of GaN/Si transistors or GaN/Si ICs is completed. The step 202 includes, in examples, forming a plurality of semiconductor chips, where each of the chips comprises a silicon substrate with one or more GaN transistors or GaN ICs formed on the silicon substrate. To illustrate the step 202, reference is made to FIGS. 3A-3D and 4A-4D. In FIG. 3A, at 302, a semiconductor chip including a silicon substrate and one or more GaN transistors formed on the silicon substrate is depicted. A similar semiconductor chip including one or more GaN transistors is depicted in FIG. 1B and described above with reference to this figure. In FIG. 4A, at 402, a semiconductor chip including a silicon substrate and one or more GaN ICs formed on the silicon substrate is depicted. In completing the step 202, multiple of the semiconductor chips shown at 302 and 402 in FIGS. 3A and 4A, respectively, are fabricated.

Figure 4B:
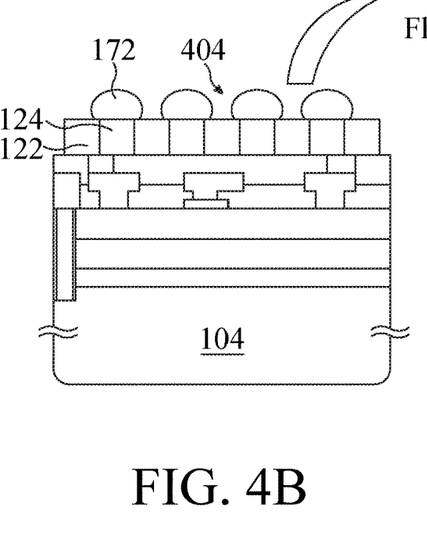

With reference again to FIG. 2, at step 204, solder microbumps are formed on a top metal of the GaN transistors or GaN ICs. The step 204 is illustrated in FIG. 3B at 304, which depicts solder microbumps 172 formed on a top surface of the semiconductor chip including one or more GaN transistors. The top surface of the semiconductor chip includes insulating material 122 and conductive vias 124, and the solder microbumps 172 are formed over the conductive vias 124, as illustrated in the figure. The conductive vias 124 are used to make electrical connections between the microbumps 172 and portions of the one or more GaN transistors. The step 204 is also illustrated in FIG. 4B at 404, which depicts solder microbumps 172 formed on a top surface of the semiconductor chip including one or more GaN ICs. The solder microbumps 172 are specifically formed over the conductive vias 124 located at the top surface of the chip, as shown in the figure. The conductive vias 124 are used to form electrical connections between the microbumps 172 and portions of the one or more GaN ICs. As described above with reference to FIG. 1A, the microbumps 172 are relatively small in size and have diameters of approximately 10 µm or less, for instance.

Figure 4C:
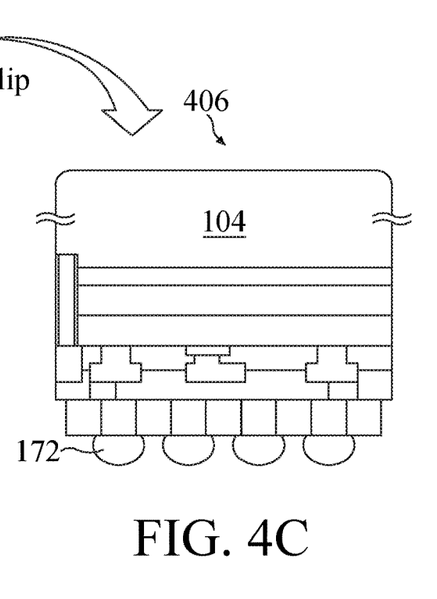
Figure 4D:
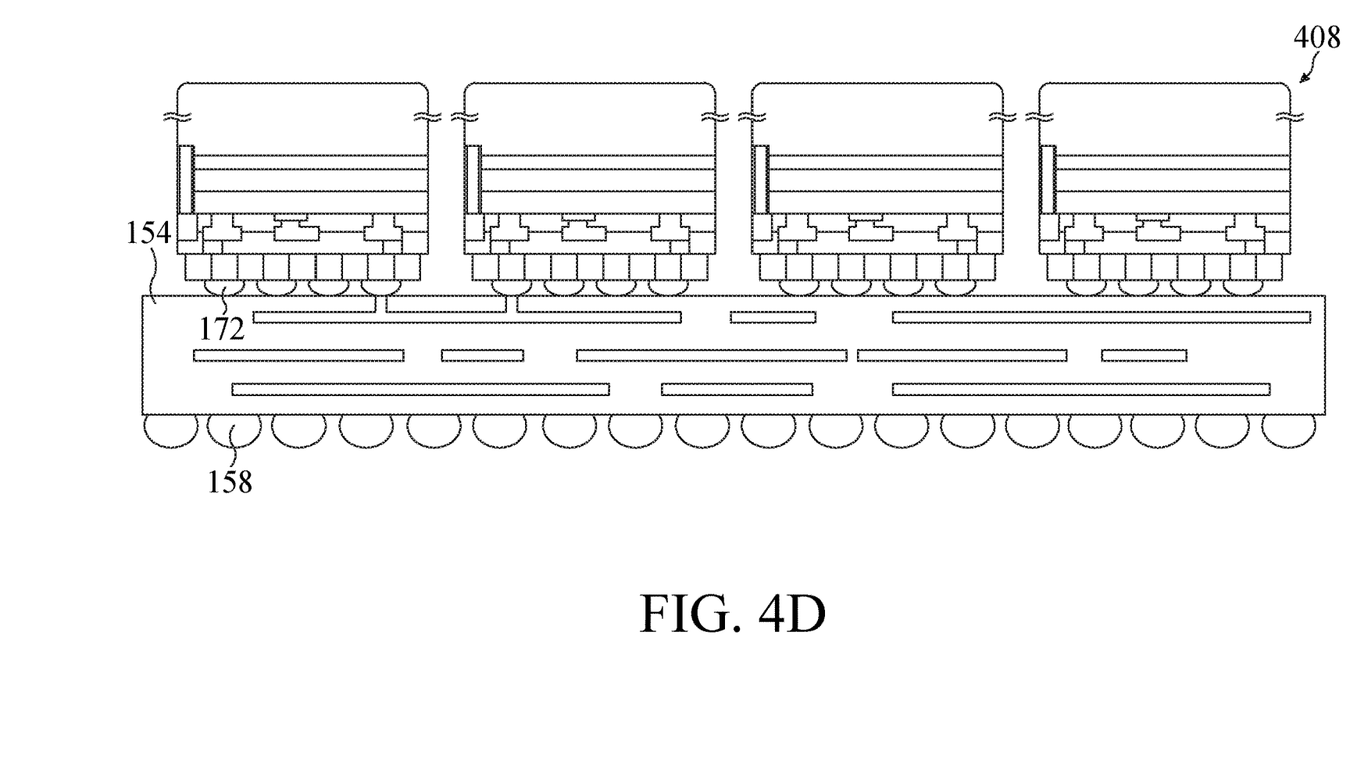

At step 206 in FIG. 2, the semiconductor chip on which the GaN transistors or GaN ICs are formed is flipped. The step 206 is depicted in FIGS. 3C and 4C at 306 and 406, respectively, which show flipping of the semiconductor chip. At step 208 in FIG. 2, the flipped semiconductor chip is "bumped" (e.g., bonded via solder microbumps) to an interposer. In examples, the step 208 includes flip-chip bonding the semiconductor chip to the interposer via the solder microbumps. The step 208 is depicted in FIGS. 3D and 4D at 308 and 408, respectively, which show bonding of the semiconductor chip to the interposer 154 via the solder microbumps 172. As discussed above, in examples, multiple semiconductor chips are formed, and each of these semiconductor chips is bonded to the interposer 154 via the solder microbumps 172, as depicted in FIGS. 3D and 4D. Air gaps or insulating passivation material separate adjacent chips bonded to the interposer 154, and in examples, the chips are bonded in an arrangement that minimizes distances between adjacent chips. In some examples, the "bumping" or bonding of the chips to the interposer 154 includes both thermal and mechanical processes, with such processes being used to heat the structure and apply pressure to complete the bonding. Such bumping processes are known to those of ordinary skill in the art.

At step 210 in FIG. 2, the interposer is soldered onto a PCB or the interposer is bumped to a package substrate. In examples, the step 210 includes bonding the interposer to the PCB or package substrate through second solder bumps that are different from the solder microbumps utilized in bonding the semiconductor chips to the interposer. FIGS. 1A and 1D depict the interposer 154 that is bonded to the PCB 152 via the solder bumps 158. FIGS. 1C and 1E depict the interposer 154 that is bonded to the package substrate 180 via the solder bumps 158. The structures shown in FIGS. 1A, 1C, 1D, and 1E result from a completion of the steps 202-210 shown in FIG. 2. As described above, there is electrical isolation between the chips bonded to the interposer as a result of the air gaps or insulating passivation material that are formed between adjacent chips. Accordingly, the chips can be operated at different body biases and/or in different power domains with little to no electrical coupling between the chips. Parasitic inductances, resistances, and capacitances between the chips are eliminated or minimized as a result of the relatively small distances between adjacent bonded chips.

Figure 5:
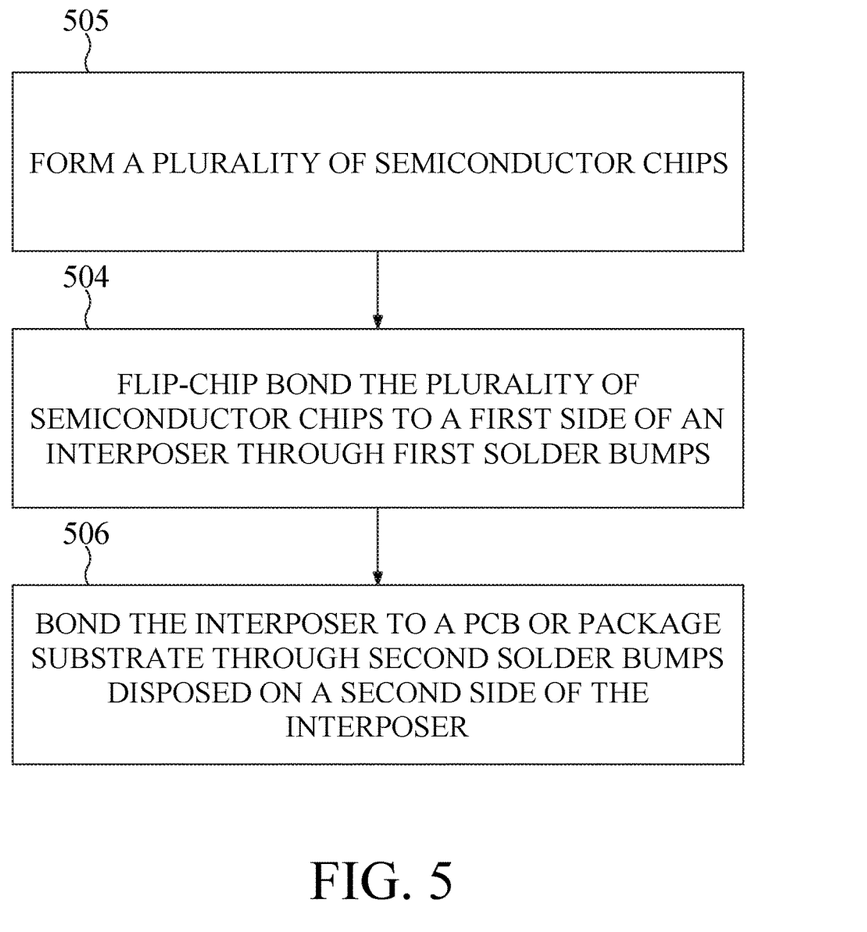
FIG. 5 is a flowchart depicting steps of an example method for forming a semiconductor structure, in accordance with some embodiments.

FIG. 5 is a flowchart depicting steps of an example method for forming a semiconductor structure, in accordance with some embodiments. At 502, a plurality of semiconductor chips (e.g., semiconductor chips 170A-170D in FIGS. 1A and 1C) are formed. Each of the semiconductor chips comprises a substrate (e.g., substrate 104 in FIG. 1B) with one or more transistors or integrated circuits (e.g., GaN transistor 106 in FIG. 1B) formed thereon. At 504, the plurality of semiconductor chips are bonded to a first side of an interposer (e.g., interposer 154 in FIGS. 1A and 1C) through first solder bumps (e.g., solder bumps 172 in FIGS. 1A and 1C) having a first pitch. At 506, the interposer is bonded to a printed circuit board (PCB) (e.g., PCB 152 in FIG. 1A) or package substrate (e.g., package substrate 180 in FIG. 1C) through second solder bumps (e.g., solder bumps 158 in FIGS. 1A and 1C) disposed on a second side of the interposer. The second solder bumps have a second pitch that is greater than the first pitch.

The present disclosure is directed to semiconductor package structures and methods of forming the same. An example semiconductor package structure includes a printed circuit board (PCB) or package substrate. An interposer is bonded to the PCB or package substrate through first solder bumps disposed on a first side of the interposer, where the first solder bumps have a first pitch. The semiconductor package structure further includes a plurality of semiconductor chips. Each of the semiconductor chips is bonded to a second side of the interposer through second solder bumps having a second pitch that is less than the first pitch. Each of the semiconductor chips includes a substrate with one or more transistors or integrated circuits formed thereon.

In an example method of forming a semiconductor structure, a plurality of semiconductor chips are formed. Each of the semiconductor chips comprises a substrate with one or more transistors or integrated circuits formed thereon. The plurality of semiconductor chips are bonded to a first side of an interposer through first solder bumps having a first pitch. The interposer is bonded to a printed circuit board (PCB) or package substrate through second solder bumps disposed on a second side of the interposer. The second solder bumps have a second pitch that is greater than the first pitch.

In another example method, a plurality of semiconductor chips are bonded to a first side of an interposer through first solder bumps. Each of the semiconductor chips includes a substrate with one or more transistors or integrated circuits formed thereon. The interposer is bonded to a printed circuit board (PCB) or package substrate through second solder bumps disposed on a second side of the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a plurality of semiconductor chips, each of the semiconductor chips comprising a substrate with one or more transistors or integrated circuits formed thereon;
    forming, on a top surface of each of the plurality of semiconductor chips, first solder bumps having a first pitch;
    flipping the plurality of semiconductor chips having the first solder bumps formed thereon;
    bonding the flipped plurality of semiconductor chips to a first side of an interposer through the first solder bumps in an arrangement that includes air gaps separating adjacent semiconductor chips, the air gaps abutting respective side surfaces of the adjacent semiconductor chips; and
    bonding the interposer to a printed circuit board (PCB) or package substrate through second solder bumps disposed on a second side of the interposer, the second solder bumps having a second pitch that is greater than the first pitch.

2. The method of claim 1, wherein the first solder bumps are separated by a first bump-to-bump pitch and the second solder bumps are separated by a second bump-to-bump pitch that is greater than the first bump-to-bump pitch.

3. The method of claim 1, wherein the flip-chip bonding of the semiconductor chips to the first side of the interposer comprises:
    bonding the plurality of semiconductor chips to the first side of the interposer in an arrangement that minimizes distances between adjacent semiconductor chips bonded to the interposer.

4. The method of claim 1, wherein diameters of the second solder bumps are greater than diameters of the first solder bumps.

5. The method of claim 1, wherein the one or more transistors or integrated circuits include a first layer of III-V semiconductor material, and wherein the forming of a semiconductor chip of the plurality of semiconductor chips comprises:
    forming the first layer of III-V semiconductor material over the substrate; and
    forming a second layer of III-V semiconductor material on the first layer of III-V semiconductor material, wherein the one or more transistors or integrated circuits comprise a high electron mobility transistor (HEMT) that includes the first layer of III-V semiconductor material and the second layer of III-V semiconductor material.

6. The method of claim 1, wherein the bonding of the flipped plurality of semiconductor chips to the first side of the interposer comprises performing a flip-chip bonding technique.

7. A method of forming a semiconductor structure, the method comprising:
    forming a plurality of semiconductor chips, each of the semiconductor chips comprising a substrate with one or more transistors or integrated circuits formed thereon;
    forming, on a top surface of each of the plurality of semiconductor chips, first solder bumps;
    flipping the plurality of semiconductor chips having the first solder bumps formed thereon;
    bonding the flipped plurality of semiconductor chips to a first side of an interposer through the first solder bumps in an arrangement that includes air gaps separating adjacent semiconductor chips, the air gaps abutting respective side surfaces of the adjacent semiconductor chips; and
    bonding the interposer to a printed circuit board (PCB) or package substrate through second solder bumps disposed on a second side of the interposer.

8. The method of claim 7, wherein the first solder bumps are separated by a first bump-to-bump pitch and the second solder bumps are separated by a second bump-to-bump pitch that is greater than the first bump-to-bump pitch.

9. The method of claim 7, wherein the bonding of the semiconductor chips to the first side of the interposer comprises:
    bonding the plurality of semiconductor chips to the first side of the interposer in an arrangement that minimizes distances between adjacent semiconductor chips bonded to the interposer.

10. The method of claim 7, wherein diameters of the second solder bumps are greater than diameters of the first solder bumps.

11. The method of claim 7, further comprising:
    forming, on a top surface of each of the semiconductor chips, the first solder bumps, wherein the bonding of the plurality of semiconductor chips to the first side of the interposer comprises performing a flip-chip bonding technique.

12. The method of claim 7, wherein the one or more transistors or integrated circuits include a first layer of III-V semiconductor material, the method further comprising:
    forming the plurality of semiconductor chips, wherein the forming of a semiconductor chip of the plurality of semiconductor chips includes forming the first layer of III-V semiconductor material over the substrate.

13. The method of claim 12, wherein the first layer of III-V semiconductor material comprises gallium nitride (GaN), and wherein the forming of the semiconductor chip of the plurality of semiconductor chips further comprises:
    forming a second layer of III-V semiconductor material on the first layer of III-V semiconductor material, the second layer of III-V semiconductor material comprising aluminum gallium nitride (AlGaN), wherein the one or more transistors or integrated circuits comprise a high electron mobility transistor (HEMT) that includes the first layer of III-V semiconductor material and the second layer of III-V semiconductor material.

14. A method of forming a semiconductor structure, the method comprising:
forming a plurality of semiconductor chips, each of the semiconductor chips comprising a substrate with one or more transistors or integrated circuits formed thereon;
forming, on a top surface of each of the plurality of semiconductor chips, first solder bumps having a first pitch;
flipping the plurality of semiconductor chips having the first solder bumps formed thereon;
bonding the flipped plurality of semiconductor chips to a first side of an interposer through the first solder bumps in an arrangement that includes air gaps separating adjacent semiconductor chips, the air gaps abutting respective side surfaces of the adjacent semiconductor chips;
bonding the interposer to a top surface of a package substrate through second solder bumps disposed on a second side of the interposer, the second solder bumps having a second pitch that is greater than the first pitch; and
forming, directly on a bottom surface of the package substrate, third solder bumps.

15. The method of claim 14, wherein the air gaps provide electrical isolation between the adjacent chips.

16. The method of claim 14, wherein the bonding of the semiconductor chips to the first side of the interposer comprises:
bonding the plurality of semiconductor chips to the first side of the interposer in an arrangement that minimizes distances between adjacent semiconductor chips bonded to the interposer.

17. The method of claim 14, wherein diameters of the second solder bumps are greater than diameters of the first solder bumps.

18. The method of claim 17, wherein the bonding of the plurality of semiconductor chips to the first side of the interposer comprises performing a flipchip bonding technique.

19. The method of claim 14, wherein the one or more transistors or integrated circuits include a first layer of III-V semiconductor material, the method further comprising:
forming the plurality of semiconductor chips, wherein the forming of a semiconductor chip of the plurality of semiconductor chips includes forming the first layer of III-V semiconductor material over the substrate.

20. The method of claim 19, wherein the first layer of III-V semiconductor material comprises gallium nitride (GaN), and wherein the forming of the semiconductor chip of the plurality of semiconductor chips further comprises:
forming a second layer of III-V semiconductor material on the first layer of III-V semiconductor material, the second layer of III-V semiconductor material comprising aluminum gallium nitride (AlGaN), wherein the one or more transistors or integrated circuits comprise a high electron mobility transistor (HEMT) that includes the first layer of III-V semiconductor material and the second layer of III-V semiconductor material.

* * * * *